US012377756B2

(12) United States Patent
Yanagita

(10) Patent No.: US 12,377,756 B2
(45) Date of Patent: Aug. 5, 2025

(54) ELECTRIC POWER CONTROL APPARATUS, FUEL CELL SYSTEM, VEHICLE, AND RECORDING MEDIUM

(71) Applicant: SUBARU CORPORATION, Tokyo (JP)

(72) Inventor: Michita Yanagita, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 0 days.

(21) Appl. No.: 18/249,493

(22) PCT Filed: Oct. 12, 2021

(86) PCT No.: PCT/JP2021/037781
§ 371 (c)(1),
(2) Date: Apr. 18, 2023

(87) PCT Pub. No.: WO2023/062728
PCT Pub. Date: Apr. 20, 2023

(65) Prior Publication Data
US 2024/0262253 A1 Aug. 8, 2024

(51) Int. Cl.
B60L 58/40 (2019.01)
B60L 15/20 (2006.01)
(Continued)

(52) U.S. Cl.
CPC ............ B60L 58/40 (2019.02); B60L 15/20 (2013.01); B60L 50/75 (2019.02); G01R 31/007 (2013.01);
(Continued)

(58) Field of Classification Search
None
See application file for complete search history.

(56) References Cited

U.S. PATENT DOCUMENTS

2009/0226770 A1* 9/2009 Manabe ............ H01M 8/04947
429/431
2013/0103224 A1 4/2013 Egami et al.
2013/0149628 A1* 6/2013 Ogawa ............ H01M 8/04225
429/450

FOREIGN PATENT DOCUMENTS

JP 2003-331930 A 11/2003
JP 2007-018741 A 1/2007
(Continued)

OTHER PUBLICATIONS

Japanese Office Action Mailed Aug. 20, 2024 for Japanese Patent Application No. 2023-553802 (2 pages in Japanese; 2 pages English translation).

Primary Examiner — Jas A Sanghera
(74) Attorney, Agent, or Firm — Smith, Gambrell & Russell, LLP

(57) ABSTRACT

An electric power control apparatus is for a fuel cell system including an impedance measurement unit that measures an impedance of the fuel cell based on a current and a voltage measured when alternating-current electric power is superimposed on output electric power of the fuel cell. A processor of the electric power control apparatus: estimates a remaining capacity of the electric power storage device after execution of a process of measuring the impedance; performs charging and discharging of the electric power storage device before start of the process of measuring the impedance, to make the estimated remaining capacity fall within a predetermined range from a lower limit value to an upper limit value; and controls electric power generation of the fuel cell to make a generated current of the fuel cell constant, during the execution of the process of measuring the impedance.

17 Claims, 6 Drawing Sheets

(51) Int. Cl.
  *B60L 50/75* (2019.01)
  *G01R 31/00* (2006.01)
  *G01R 31/388* (2019.01)
  *G01R 31/389* (2019.01)
  *H01M 8/04537* (2016.01)
  *H01M 8/04858* (2016.01)
  *H01M 16/00* (2006.01)
  *H02J 7/00* (2006.01)

(52) U.S. Cl.
  CPC ......... *G01R 31/388* (2019.01); *G01R 31/389* (2019.01); *H01M 8/04544* (2013.01); *H01M 8/04574* (2013.01); *H01M 8/04634* (2013.01); *H01M 8/04925* (2013.01); *H01M 16/006* (2013.01); *H02J 7/0048* (2020.01); *H02J 7/00712* (2020.01); *H01M 2220/20* (2013.01); *H01M 2250/20* (2013.01); *H01M 2250/402* (2013.01)

(56) References Cited

FOREIGN PATENT DOCUMENTS

| | | | |
|---|---|---|---|
| JP | 2009-134894 A | 9/2009 | |
| JP | 2013/093120 A | 5/2013 | |
| JP | 2014-212018 A | 11/2014 | |
| WO | 2016-059709 A1 | 4/2016 | |

* cited by examiner

[ FIG. 1 ]
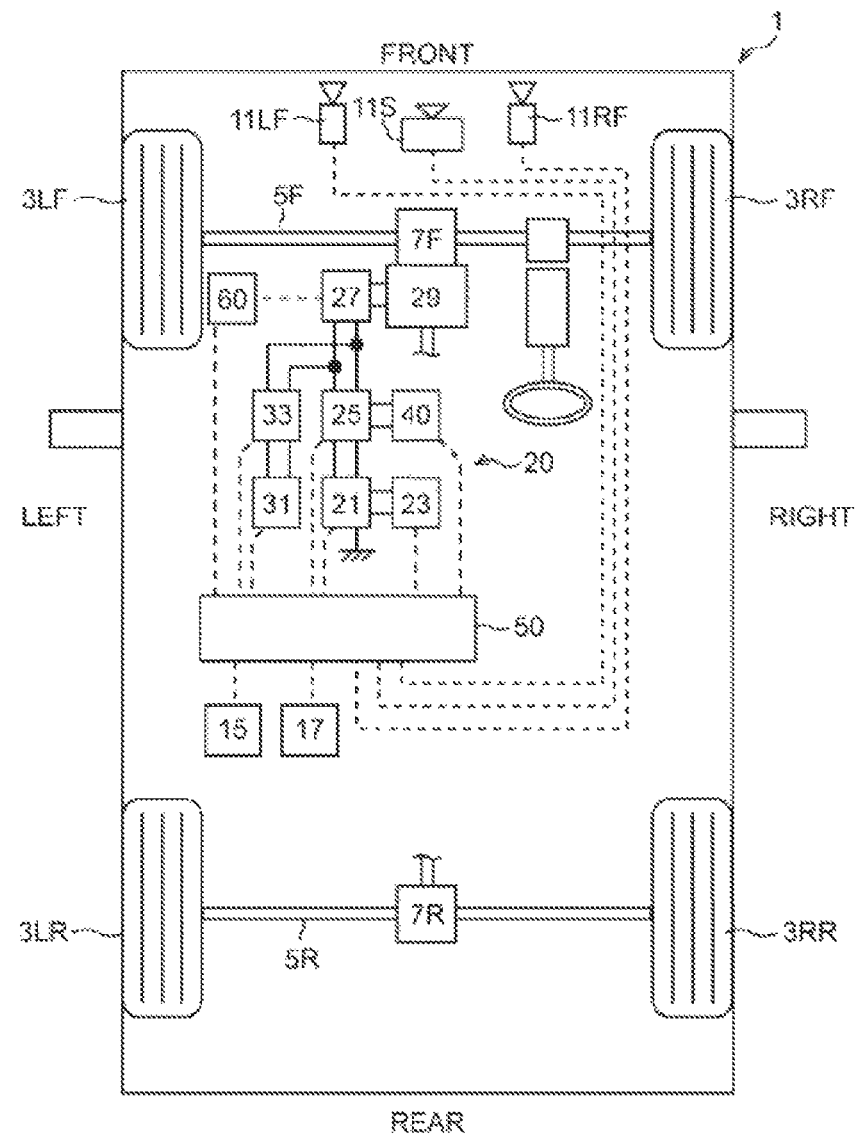

[FIG. 2]
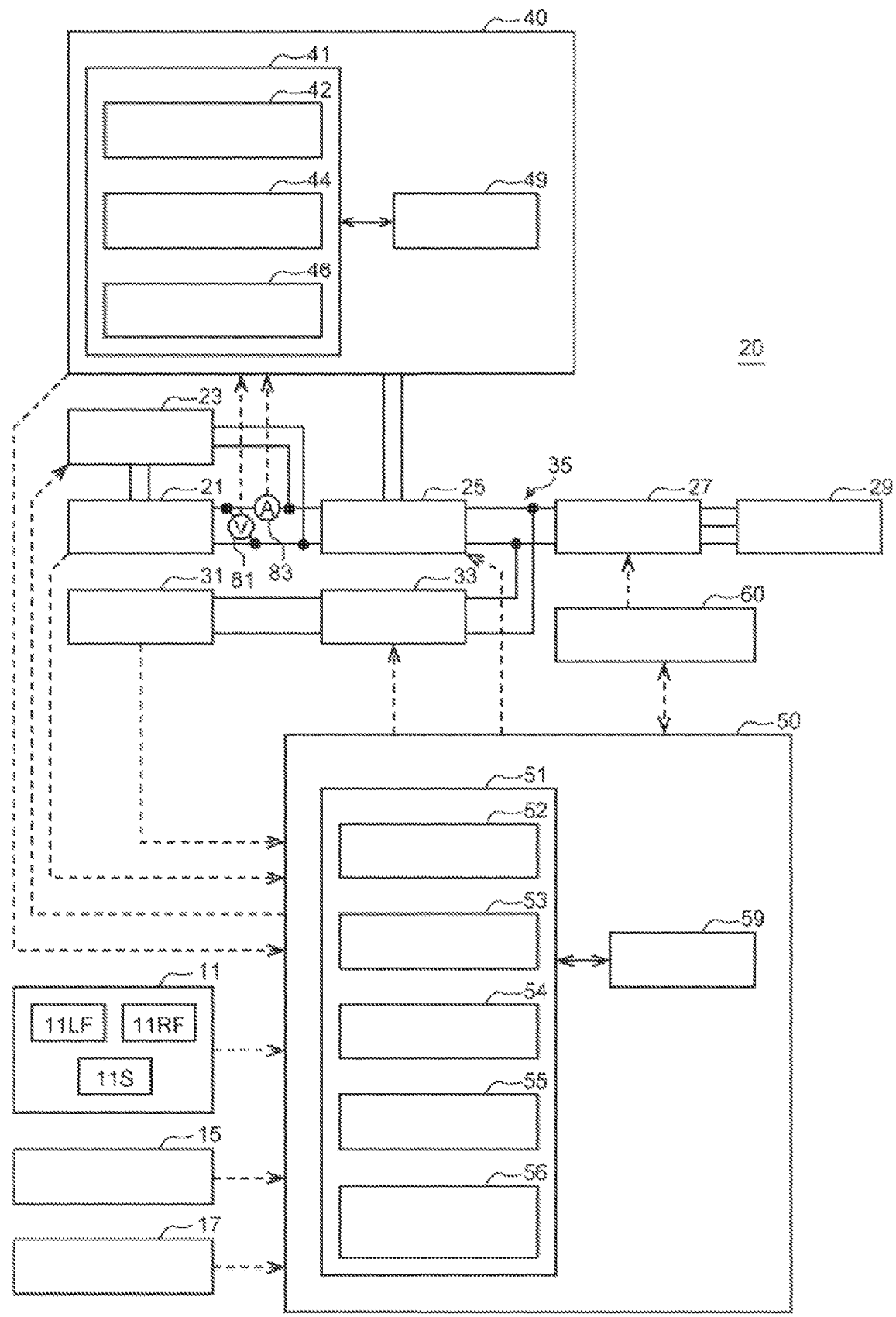

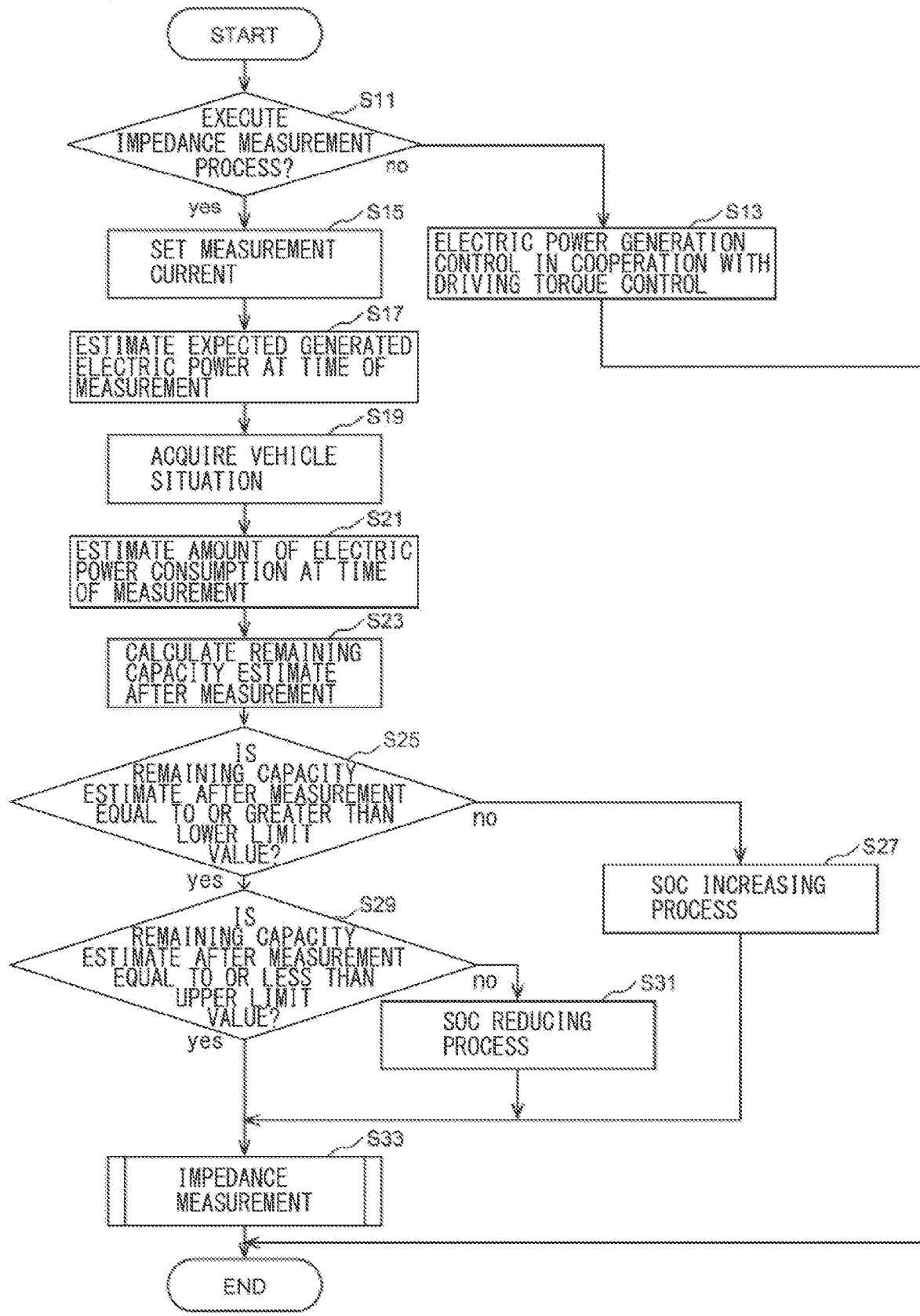

[FIG. 4]
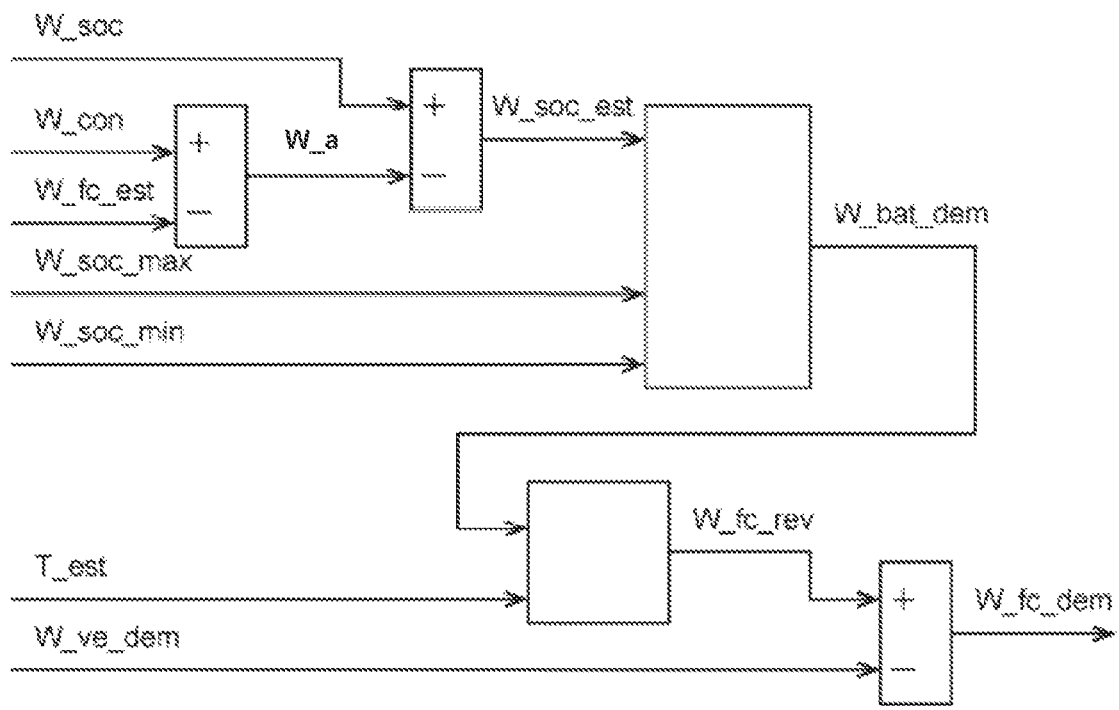

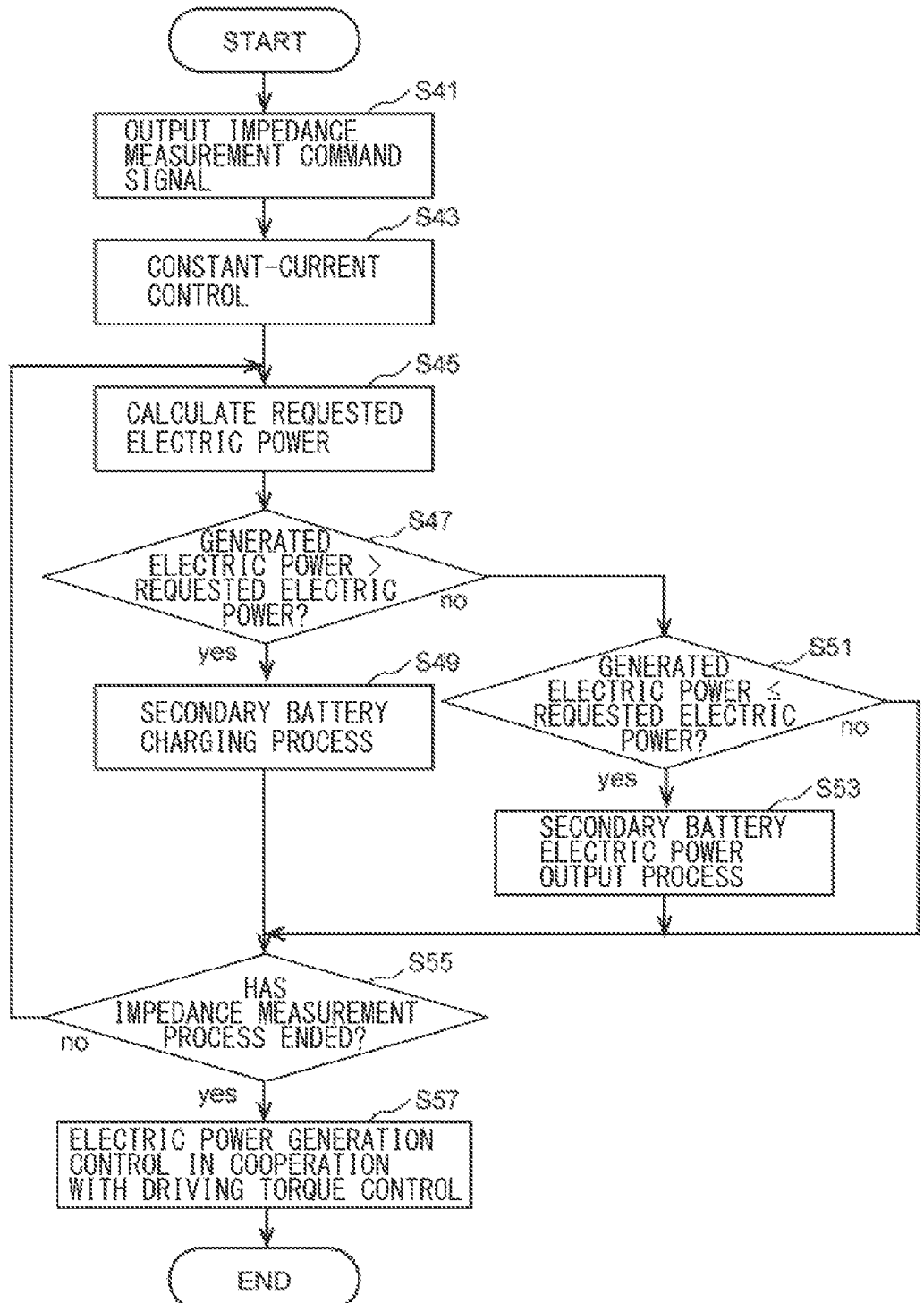

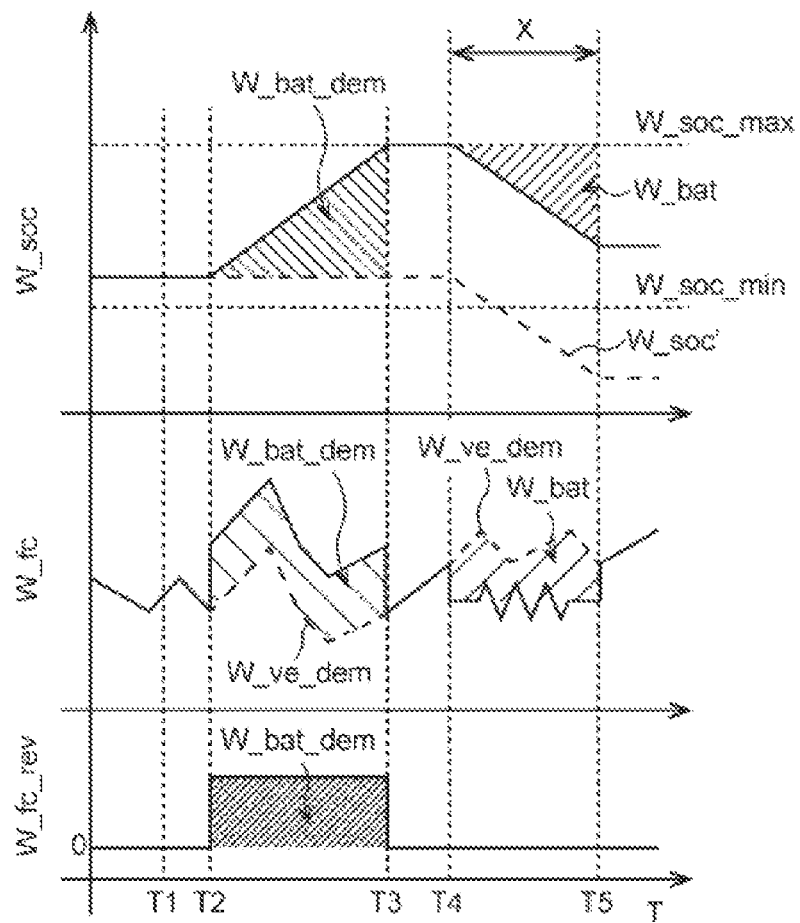
[FIG. 6]

ELECTRIC POWER CONTROL APPARATUS, FUEL CELL SYSTEM, VEHICLE, AND RECORDING MEDIUM

CROSS-REFERENCE TO RELATED APPLICATIONS

This application is the U.S. National Phase under 35 U.S.C. § 371 of International Application No. PCT/JP2021/037781, filed on Oct. 12, 2021.

TECHNICAL FIELD

The disclosure relates to an electric power control apparatus, a fuel cell system, a vehicle, and a recording medium.

BACKGROUND ART

Electrochemical impedance spectroscopy has been known as a method of diagnosing an internal state of a fuel cell such as a polymer electrolyte fuel cell (PEFC). The electrochemical impedance spectroscopy performs a process of calculating an impedance on the basis of a waveform of output electric power obtained in a case where output electric power of the fuel cell is outputted with a sinusoidal alternating-current signal superimposed thereon. Using the electrochemical impedance spectroscopy makes it possible to diagnose the internal state of the fuel cell, from membrane resistance, reaction resistance, or mass transfer resistance calculated on the basis of the impedance regarding each frequency of the superimposed alternating-current signal.

For example, Patent Literature 1 proposes a sequential impedance measurement apparatus that performs measurement with a relatively high accuracy in a wide-range frequency band in a short time, and additionally measures a phenomenon appearing in a different frequency band at the same time, while applying a signal close to normal battery output fluctuation. Specifically, Patent Literature 1 discloses the sequential impedance measurement apparatus including: a M-sequence signal generation unit that generates a M-sequence signal having a white property; a superimposed signal generation unit that generates a superimposed signal; a signal processing unit that outputs the M-sequence signal and the superimposed signal; a signal addition unit that applies and superimposes an output signal of the signal processing unit on an electric power indication value of a control processor; a current and voltage measurement unit that acquires a current and a voltage of a fuel cell; and an impedance calculator that calculates an impedance of the fuel cell on the basis of the current and voltage measured values. In the disclosed technique, the control processor changes a method of controlling the fuel cell depending on a calculation result obtained by the impedance calculator.

CITATION LIST

Patent Literature

Patent Literature 1: Japanese Unexamined Patent Application Publication No. 2013-093120

SUMMARY OF INVENTION

Problem to be Solved by the Invention

However, the sequential impedance measurement apparatus disclosed in Patent Literature 1 is configured to measure the impedance by using a measuring device that is able to perform high-speed sampling and a calculator that is able to perform high-speed processing, which results in an expensive system and hindrance to mounting of the fuel cell on a vehicle. In addition, a fuel cell vehicle is influenced by electric power load fluctuation caused by acceleration or deceleration, and it is therefore not easy to diagnose an internal state of a fuel cell while the fuel cell vehicle is traveling. In particular, mass transfer resistance of the fuel cell is calculatable on the basis of an impedance in a region where a frequency band of an alternating-current signal is relatively low. However, impedance measurement in the low frequency band region is not easy, because electric power load fluctuation caused by driving torque fluctuation during traveling of the fuel cell vehicle exerts a great influence as a measurement error.

In view of this, the influence of the electric power load fluctuation on the impedance measurement may be reduced by making a generated current of the fuel cell constant. In the fuel cell vehicle, in a case where an excess or shortage of output electric power of the fuel cell occurs with respect to requested electric power, electric power corresponding to the excess or shortage is made up for by a secondary battery. The secondary battery is controlled to have a remaining capacity equal to or greater than a predetermined lower limit value and equal to or less than an upper limit value, to suppress deterioration caused by overcharge or overdischarge, or to prevent an electric power shortage or a decrease in electric power efficiency (electric power utilization efficiency). However, in a case where the generated current of the fuel cell is made constant, the remaining capacity of the secondary battery can fall below the lower limit value or exceed the upper limit value after the end of an impedance measurement process.

The disclosure has been made in view of the above-described issue, and it is an object of the disclosure to provide an electric power control apparatus, a fuel cell system, a vehicle, and a recording medium that make it possible to determine an internal state of a fuel cell more accurately during traveling of a fuel cell vehicle, while suppressing overdischarge or overcharge of a secondary battery.

Means for Solving the Problem

To solve the above-described problem, an aspect of the disclosure provides an electric power control apparatus for a fuel cell system provided with a fuel cell, an electric power storage device, and a drive motor. The fuel cell system includes an impedance measurement unit configured measure an impedance of the fuel cell based on a current and a voltage measured when alternating-current electric power is superimposed on output electric power of the fuel cell. The electric power control apparatus includes: one or more processors; and one or more memories communicably coupled to the one or more processors. The one or more processors are configured to execute processing including: estimating a remaining capacity of the electric power storage device after execution of a process of measuring the impedance; performing charging and discharging of the electric power storage device before start of the process of measuring the impedance, to make the estimated remaining capacity fall within a predetermined range from a lower limit value to an upper limit value; and controlling electric power generation of the fuel cell to make a generated current of the fuel cell constant, during the execution of the process of measuring the impedance.

To solve the above-described problem, another aspect of the disclosure provides an electric power control apparatus for a fuel cell system provided with a fuel cell, an electric power storage device, and a drive motor. The fuel cell system includes an impedance measurement unit configured measure an impedance of the fuel cell based on a current and a voltage measured when alternating-current electric power is superimposed on output electric power of the fuel cell. The electric power control apparatus includes: an electric power supply control unit configured to control electric power generation of the fuel cell based on a target driving torque of the drive motor set depending on a requested acceleration rate of a fuel cell vehicle, and controls the electric power generation of the fuel cell to make a generated current of the fuel cell constant during execution of a process of measuring the impedance; a remaining capacity estimation unit configured to estimate a remaining capacity of the electric power storage device after the execution of the process of measuring the impedance; and a battery charging and discharging control unit configured to perform charging and discharging of the electric power storage device before start of the process of measuring the impedance, to make the estimated remaining capacity equal to or greater than a predetermined lower limit value and equal to or less than a predetermined upper limit value.

To solve the above-described problem, another aspect of the disclosure provides a fuel cell system including any of the electric power control apparatuses described above.

To solve the above-described problem, another aspect of the disclosure provides a vehicle including the fuel cell system described above.

To solve the above-described problem, another aspect of the disclosure provides a recording medium containing a computer program to be applied to a fuel cell system provided with a fuel cell, an electric power storage device, and a drive motor. The fuel cell system includes an impedance measurement unit configured to measure an impedance of the fuel cell based on a current and a voltage measured when alternating-current electric power is superimposed on output electric power of the fuel cell. The computer program causes one or more processors to execute processing including: estimating a remaining capacity of the electric power storage device after execution of a process of measuring the impedance; performing charging and discharging of the electric power storage device before start of the process of measuring the impedance, to make the estimated remaining capacity fall within a predetermined range from a lower limit value to an upper limit value; and controlling electric power generation of the fuel cell to make a generated current of the fuel cell constant, during the execution of the process of measuring the impedance.

Effects of the Invention

According to the disclosure as described above, it is possible to determine an internal state of a fuel cell more accurately during traveling of a fuel cell vehicle, while suppressing overdischarge or overcharge of a secondary battery.

BRIEF DESCRIPTION OF DRAWINGS

FIG. 1 is a schematic diagram illustrating an example of a vehicle equipped with a fuel cell system to which an electric power control apparatus according to an embodiment of the disclosure is applicable.

FIG. 2 is a block diagram illustrating a configuration example of the fuel cell system to which the electric power control apparatus according to the embodiment is applied.

FIG. 3 is a flowchart illustrating an example of a process to be performed by the electric power control apparatus according to the embodiment.

FIG. 4 is an explanatory diagram illustrating an example of a process of calculating generation target electric power of a fuel cell before start of an impedance measurement process by the electric power control apparatus according to the embodiment.

FIG. 5 is a flowchart illustrating a process to be performed by the electric power control apparatus during the impedance measurement process by the electric power control apparatus according to the embodiment.

FIG. 6 is an explanatory diagram illustrating workings of electric power generation control on the fuel cell by the electric power control apparatus according to the embodiment.

MODES FOR CARRYING OUT THE INVENTION

In the following, some preferred embodiments of the disclosure are described in detail with reference to the accompanying drawings. Throughout the present description and the drawings, elements having substantially the same function and configuration are denoted with the same reference numerals to avoid any redundant description.

1. Overall Configuration of Fuel Cell Vehicle

Description is given first of an example of an overall configuration of a fuel cell vehicle 1 equipped with an electric power control apparatus according to an embodiment of the disclosure.

FIG. 1 is a schematic diagram illustrating an example of the fuel cell vehicle 1 equipped with a fuel cell system 20 including an electric power control apparatus 50. FIG. 2 is a block diagram illustrating a configuration example of the fuel cell system 20. Note that FIG. 2 illustrates a functional configuration related to a process of measuring an impedance of a fuel cell 21, of the configuration of an impedance measurement apparatus (impedance measurement unit) 40 and the electric power control apparatus 50.

The fuel cell vehicle 1 illustrated in FIG. 1 is configured as a four-wheel-drive vehicle that transmits driving torque to a left front wheel 3LF, a right front wheel 3RF, a left rear wheel 3LR, and a right rear wheel 3RR (hereinafter collectively referred to as "wheels 3" unless a distinction is to be made between them). The driving torque is outputted from a drive motor 29 that generates vehicle driving torque. The drive motor 29 outputs the driving torque to be transmitted to a front-wheel drive axle 5F and a rear-wheel drive axle 5R via an unillustrated transmission and a front-wheel differential mechanism 7F and a rear-wheel differential mechanism 7R.

Note that the fuel cell vehicle 1 may be, for example, a vehicle including two drive motors of a front wheel drive motor and a rear wheel drive motor, or a vehicle including drive motors corresponding to the respective wheels 3.

The fuel cell system 20 includes, the fuel cell 21, a fuel cell auxiliary equipment 23, a converter 25, an inverter 27, the drive motor 29, a secondary battery 31, a secondary battery converter 33, the impedance measurement apparatus 40, and the electric power control apparatus 50.

The drive motor 29 is a three-phase alternating-current motor including a three-phase coils including U-phase, V-phase, and W-phase coils, and is driven by being supplied with three-phase alternating-current electric power from the fuel cell system 20.

The fuel cell 21 is configured as, for example, a solid polymer electrolyte fuel cell, and has a stacked structure including multiple fuel cells stacked. Each fuel cell includes a membrane electrode assembly (MEA) in which a hydrogen electrode and an oxygen electrode are provided on respective opposite sides of an electrolyte membrane including an ion exchange membrane, and a gas diffusion layer is provided on the hydrogen electrode and on the oxygen electrode. In addition, the fuel cell includes a pair of separators disposed to sandwich the MEA. Hydrogen gas is supplied to a hydrogen gas flow channel provided on the hydrogen electrode, air is supplied to an air flow channel provided on the oxygen electrode, and electric power generation is performed by an electrochemical reaction occurring between the supplied hydrogen gas and air. The fuel cell 21 outputs generated direct-current electric power to the converter 25.

The fuel cell auxiliary equipment 23 includes equipment that adjusts pressures and flow rates of the hydrogen gas (fuel gas) and the air (oxidizing gas) to be supplied to the fuel cell 21. For example, the fuel cell auxiliary equipment 23 includes a pressure reducing valve, a back pressure control valve, and a hydrogen circulation pump, as equipment that adjusts the pressure and the flow rate of the hydrogen gas to be supplied to the fuel cell 21. The pressure reducing valve reduces the pressure of the hydrogen gas in a high-pressure hydrogen tank and supplies the resulting hydrogen gas to the fuel cell 21. The back pressure control valve adjusts the pressure of the hydrogen gas in the fuel cell 21 by adjusting a flow rate of hydrogen off-gas to be exhausted from the fuel cell 21. The hydrogen circulation pump supplies the hydrogen off-gas to the fuel cell 21 again.

In addition, the fuel cell auxiliary equipment 23 includes a compressor inverter and a back pressure control valve, as equipment that adjusts the pressure and the flow rate of the air to be supplied to the fuel cell 21. The compressor inverter controls output of a compressor to adjust the flow rate of the air to be supplied to the fuel cell 21. The back pressure control valve adjusts the pressure of the air in the fuel cell 21 by adjusting a flow rate of oxidizing off-gas to be exhausted from the fuel cell 21.

The fuel cell auxiliary equipment 23 is electronic equipment that operates by being supplied with the direct-current electric power outputted from the fuel cell 21. Driving of the fuel cell auxiliary equipment 23 is controlled by the electric power control apparatus 50. Note that the fuel cell auxiliary equipment 23 configured to operate the fuel cell 21 is not limited to the example described above, and may include other equipment. For example, the fuel cell auxiliary equipment 23 may include a coolant circulation pump for circulation of a coolant that cools the fuel cell 21.

The converter 25 is configured as a DCDC converter that converts the direct-current electric power outputted from the fuel cell 21 into direct-current electric power at a desired level, and supplies the resulting direct-current electric power to the inverter 27. The converter 25 includes a chopper circuit, and allows two switching devices, for example, to operate to thereby raise or lower a voltage of the direct-current electric power outputted from the fuel cell 21, and supply the resulting direct-current electric power to the inverter 27. Driving of the switching devices of the converter 25 is controlled by the electric power control apparatus 50.

The inverter 27 converts the direct-current electric power outputted from the converter 25 into three-phase alternating-current electric power, and supplies the resulting electric power to the drive motor 29. The inverter 27 includes respective unillustrated arm circuits corresponding to the U-phase, V-phase, and W-phase coils of the drive motor 29. Each arm circuit includes an upper arm electrically coupled to a positive electrode side of the fuel cell 21, and a lower arm electrically coupled to a negative electrode side of the fuel cell 21. The upper arm and the lower arm of each arm circuit are each provided with a switching device to which a diode is electrically coupled in anti-parallel. For example, a metal oxide semiconductor field effect transistor (MOSFET) or an insulated gate bipolar transistor (IGBT) is used as the switching device. The U-phase, V-phase, and W-phase coils of the drive motor 29 are each electrically coupled to a joint between the upper arm and the lower arm of the corresponding arm circuit. In addition, when the fuel cell vehicle 1 decelerates, the inverter 27 regeneratively drives the drive motor 29, converts the generated three-phase alternating-current electric power into direct-current electric power, and supplies the resulting direct-current electric power to a direct-current stage 35. Driving of the switching devices provided in each arm circuit of the inverter 27 is controlled by a vehicle drive control apparatus 60.

The vehicle drive control apparatus 60 includes one or more processors such as a central processing unit (CPU), and one or more memories communicably coupled to the processor. For example, the vehicle drive control apparatus 60 controls driving of the drive motor 29 on the basis of a requested acceleration rate set on the basis of an amount of operation of an accelerator pedal to be operated by a driver or the requested acceleration rate set by an automatic driving control process. Specifically, the vehicle drive control apparatus 60 controls driving of the inverter 27 depending on a target driving torque set on the basis of the requested acceleration rate. Thus, the drive motor 29 is driven, and the driving torque for the fuel cell vehicle 1 is outputted.

In addition, for example, the vehicle drive control apparatus 60 controls regeneration of the drive motor 29 on the basis of a requested deceleration rate set on the basis of an amount of operation of a brake pedal to be operated by the driver or the requested deceleration rate set by the automatic driving control process. Specifically, the vehicle drive control apparatus 60 controls driving of the inverter 27 depending on a target regenerative torque set on the basis of the requested deceleration rate. Thus, the drive motor 29 is regeneratively driven, generating deceleration torque for the fuel cell vehicle 1, and regenerative generated electric power is outputted to the direct-current stage 35.

To the direct-current stage 35 that couples the converter 25 and the inverter 27, the secondary battery 31 is coupled via the secondary battery converter 33. The secondary battery 31 is one mode of an electric power storage device, and is configured as, for example, a rechargeable battery such as a lithium-ion battery or a nickel-metal hydride battery. The secondary battery 31 stores excess electric power, i.e., the electric power generated by the fuel cell 21 excluding the electric power to be supplied to the drive motor 29. The secondary battery 31 also stores electric power generated by regeneration of the drive motor 29. In addition, the secondary battery 31 supplies, to the drive motor 29, electric power corresponding to a shortage obtained by subtracting the electric power generated by the fuel cell 21 from the electric power to be supplied to the drive motor 29. The electric power stored in the secondary battery 31 may be supplied to unillustrated pieces of vehicle auxiliary equipment. The secondary battery 31 includes an unillustrated battery controller, and transmits information on an open-circuit voltage and a remaining capacity of the secondary battery 31 to the electric power control apparatus 50.

The secondary battery converter 33 charges the secondary battery 31 by adjusting voltages of generated electric power of the fuel cell 21 to be outputted to the direct-current stage 35 via the converter 25, and regenerative electric power of the drive motor 29 to be outputted to the direct-current stage 35 via the inverter 27. In other words, the secondary battery converter 33 is configured as a DCDC converter. The secondary battery converter 33 includes a chopper circuit, and allows two switching devices, for example, to operate to thereby lower a voltage of electric power of the direct-current stage 35 and charge the secondary battery 31 with the resulting electric power. Driving of the switching devices is controlled by the electric power control apparatus 50.

In addition, the fuel cell vehicle 1 includes front imaging cameras 11LF and 11RF, a light detection and ranging (LiDAR) 11S, a vehicle state sensor 15, and a global positioning system (GPS) sensor 17.

The front imaging cameras 11LF and 11RF and the LiDAR 11S configure a surrounding environment sensor configured to acquire information on a surrounding environment of the fuel cell vehicle 1. The front imaging cameras 11LF and 11RF perform imaging of a region in front of the fuel cell vehicle 1 to generate image data. The front imaging cameras 11LF and 11RF include an image sensor, such as a charged-coupled device (CCD) or a complementary metal-oxide-semiconductor (CMOS), and transmit the generated image data to the electric power control apparatus 50.

In the fuel cell vehicle 1 illustrated in FIG. 1, the front imaging cameras 11LF and 11RF are configured as a stereo camera including the pair of left and right cameras, but may be a monocular camera. The fuel cell vehicle 1 may include, in addition to the front imaging cameras 11LF and 11RF, one or both of a rear imaging camera 11R and a camera that is provided on a side-view mirror to perform imaging of a left rear region or a right rear region.

The LiDAR 11S transmits optical waves and receives reflected waves of the optical waves, and detects an object and a distance to the object on the basis of time from the transmission of the optical waves to the reception of the reflected waves. The LiDAR 11S transmits detection data to the electric power control apparatus 50. In place of the LiDAR 11S or together with the LiDAR 11S, the fuel cell vehicle 1 may include any one or more sensors out of a radar sensor such as a millimeter wave radar, and an ultrasonic sensor, as the surrounding environment sensor configured to acquire information on the surrounding environment.

The vehicle state sensor 15 includes one or more sensors that detect an operation state and a behavior of the fuel cell vehicle 1. The vehicle state sensor 15 includes, for example, one or more of a steering angle sensor, an accelerator position sensor, a brake stroke sensor, a brake pressure sensor, and an engine speed sensor, and detects the operation state of the fuel cell vehicle 1 such as a steering angle of a steering wheel or a steered wheel, an accelerator position, an amount of a brake operation, or an engine speed. In addition, the vehicle state sensor 15 includes, for example, one or more of a vehicle speed sensor, an acceleration rate sensor, and an angular speed sensor, and detects the behavior of the fuel cell vehicle 1 such as a vehicle speed, a longitudinal acceleration rate, a lateral acceleration rate, or a yaw rate. The vehicle state sensor 15 transmits a sensor signal including the detected information to the electric power control apparatus 50.

The GPS sensor 17 receives satellite signals transmitted from GPS satellites, and acquires position information on the fuel cell vehicle 1. Note that, in place of the GPS sensor 17, an antenna may be used to receive satellite signals from another satellite system that identifies the position of the fuel cell vehicle 1.

The electric power control apparatus 50 executes a process of controlling electric power generation and charging by the fuel cell system 20. For example, the electric power control apparatus 50 controls electric power generation of the fuel cell 21 on the basis of requested electric power of the drive motor 29. In a case where the generated electric power of the fuel cell 21 is greater than the requested electric power, the electric power control apparatus 50 charges the secondary battery 31 with excess electric power of the electric power outputted from the converter 25. In contrast, in a case where the generated electric power of the fuel cell 21 is less than the requested electric power, the electric power control apparatus 50 makes up for the electric power shortage with output electric power of the secondary battery 31. In addition, when the fuel cell vehicle 1 decelerates, the electric power control apparatus 50 charges the secondary battery 31 with the regenerative generated electric power obtained by the drive motor 29.

In addition, the impedance measurement apparatus 40 and the electric power control apparatus 50 cooperate with each other to execute the process of measuring the impedance of the fuel cell 21 and a process of diagnosing a state of the fuel cell 21. Specifically described below is a portion related to the process of measuring the impedance of the fuel cell 21 and the process of diagnosing the state of the fuel cell 21, of the configuration of the impedance measurement apparatus 40 and the electric power control apparatus 50.

2. Impedance Measurement Apparatus and Control Apparatus

Next, the impedance measurement apparatus 40 and the electric power control apparatus 50 are each described in detail. Described first is an outline of a process to be executed by the impedance measurement apparatus 40 and the electric power control apparatus 50.

(2-1. Outline)

In the fuel cell system 20 according to the example embodiment, the electric power control apparatus 50 outputs, to the impedance measurement apparatus 40, a command signal for acquisition of the impedance of the fuel cell 21. The impedance measurement apparatus 40 that has received the command signal executes the process of measuring the impedance of the fuel cell 21. The impedance measurement apparatus 40 generates an alternating-current signal for impedance measurement on the basis of the command signal transmitted from the electric power control apparatus 50, and outputs the alternating-current signal to the converter 25, to thereby superimpose the alternating-current signal with a predetermined frequency on output electric power from the fuel cell 21. In addition, the impedance measurement apparatus 40 detects an electric power waveform of the fuel cell 21 obtained in a case where the alternating-current signal is superimposed on the output electric power of the fuel cell 21, and calculates the impedance of the fuel cell 21 on the basis of data on the detected electric power waveform. The electric power control apparatus 50 acquires information on the impedance from the impedance measurement apparatus 40, and diagnoses the state of the fuel cell 21.

In a period in which the process of measuring the impedance is executed by the impedance measurement apparatus 40 (an impedance measurement period), the electric power control apparatus 50 according to the example embodiment controls output of the fuel cell 21 to make a generated current of the fuel cell 21 constant. This makes it possible to enhance calculation accuracy of the impedance based on the data on the electric power waveform obtained in a case where the alternating-current signal is superimposed. In addition, the electric power control apparatus 50 performs charging and discharging of the secondary battery 31 in advance before start of the process of measuring the impedance (an impedance measurement process), to prevent the remaining capacity of the secondary battery 31 from falling below a predetermined lower limit value or exceeding an upper limit value in the impedance measurement period or after the end of the impedance measurement period by making the generated current of the fuel cell 21 constant during the impedance measurement period.

In the following, a functional configuration of the impedance measurement apparatus 40 and the electric power control apparatus 50 is briefly described, and then processing operation to be performed by a processor 51 of the electric power control apparatus 50 is specifically described. Note that, in the example embodiment, the impedance measurement apparatus 40 is configured as an apparatus separate from the electric power control apparatus 50. However, the impedance measurement apparatus 40 may be integrated with the electric power control apparatus 50 and included as a function of the electric power control apparatus 50.

(2-2. Impedance Measurement Apparatus)

The impedance measurement apparatus 40 serves as an apparatus that measures the impedance of the fuel cell 21 by allowing one or more processors such as a CPU to execute a computer program. The computer program is a computer program that causes the processor to perform operation described later to be performed by the impedance measurement apparatus 40. The computer program to be executed by the processor may be contained in a recording medium serving as a storage (memory) 49 provided in the impedance measurement apparatus 40, or may be contained in a recording medium built in the impedance measurement apparatus 40 or any recording medium externally attachable to the impedance measurement apparatus 40.

The recording medium containing the computer program may be: a magnetic medium such as a hard disk, a floppy disk, or a magnetic tape; an optical recording medium such as a compact disk read only memory (CD-ROM), a digital versatile disk (DVD), or a Blu-ray (registered trademark); a magnetic-optical medium such as a floptical disk; a memory such as a random access memory (RAM) or a read only memory (ROM); a flash memory such as a universal serial bus (USB) memory or a solid state drive (SSD); or any other medium that is able to hold programs.

The impedance measurement apparatus 40 includes a processor 41 and the storage 49. The processor 41 includes one or more processors such as a CPU, and an electric circuit. A portion or all of the processor 41 may include an updatable one such as firmware, or may be a program module to be executed in accordance with a command from, for example, a CPU.

The storage 49 includes a memory that is communicably coupled to the processor, and contains, for example, a computer program to be executed by the processor, a control parameter, and acquired information. The storage 49 may include a memory such as a RAM or a ROM, or may include a memory device such as a CD-ROM or a storage device.

The impedance measurement apparatus 40 is communicably coupled to the electric power control apparatus 50 via a communication means such as a controller area network (CAN) or a dedicated line. In addition, the impedance measurement apparatus 40 is configured to acquire sensor signals of a voltage sensor 81 that detects an output voltage of the fuel cell 21 and a current sensor 83 that detects an output current from the fuel cell 21.

The processor 41 includes a superimposed signal generation unit 42, an output electric power detection unit 44, and an impedance calculation unit 46. A portion or all of the superimposed signal generation unit 42, the output electric power detection unit 44, and the impedance calculation unit 46 is a function to be implemented by execution of the computer program by the processor. Note that a portion or all of these units may be configured by an analog circuit.

(Superimposed Signal Generation Unit)

The superimposed signal generation unit 42 sets a waveform of an alternating-current signal for impedance measurement to be superimposed on the output electric power of the fuel cell 21 on the basis of a command signal from the electric power control apparatus 50, and outputs the set alternating-current signal to the converter 25. Specifically, the superimposed signal generation unit 42 sets, on the basis of the command signal transmitted from the electric power control apparatus 50, a frequency and an amplitude of a sinusoidal wave of a superimposed current to be superimposed on the output electric power. The frequency of the superimposed current is set on the basis of information on the frequency included in the command signal. The amplitude of the superimposed current may be set to an appropriate value depending on, for example, specifications of the fuel cell system 20. Alternatively, a rectangular wave signal or a M-sequence signal generated by superimposing waveform signals with multiple frequencies on each other may be used as the signal for impedance measurement to be superimposed on an output signal of the fuel cell 21. In addition, the superimposed signal generation unit 42 outputs the alternating-current signal with the set frequency and amplitude to the converter 25. The converter 25 operates the switching devices on the basis of the inputted alternating-current signal, to superimpose an alternating current waveform on the output current from the fuel cell 21.

(Output Electric Power Detection Unit)

The output electric power detection unit 44 executes, on the basis of the sensor signals outputted from the voltage sensor 81 and the current sensor 83, a process of detecting a current (output current) I and a voltage (output voltage) V of the output electric power of the fuel cell 21 outputted while the alternating current waveform is superimposed on the output electric power from the fuel cell 21. Data on the output current I and the output voltage V is detected in a preset sampling cycle, and recorded as the alternating current waveform and an alternating voltage waveform having the alternating-current signal for impedance measurement superimposed thereon.

(Impedance Calculation Unit)

The impedance calculation unit 46 executes a process of calculating the impedance of the fuel cell 21 on the basis of the recorded alternating current waveform and alternating voltage waveform. The impedance calculation unit 46 outputs information on the calculated impedance to the electric power control apparatus 50. It is known that the output voltage V, the output current I, and an impedance Z of the fuel cell 21 obtained in a case where the alternating-current signal is superimposed on the fuel cell 21 satisfy relationships in the following expressions.

$$V = V_0 \exp j(\omega t + \Phi)$$
$$I = I_0 \exp j\omega t$$
$$Z = V/I = (V_0/I_0)\exp j\Phi = Z' + jZ''$$

$V_0$: amplitude of output voltage
$I_0$: amplitude of output current
$\omega$: each frequency
$\Phi$: initial phase
$Z'$: resistance component (real component)
$Z''$: reactance component (imaginary component)
j: imaginary unit
t: time On the basis of the above expressions, the impedance calculation unit 46 calculates the impedance at each frequency, from the amplitudes of the alternating current waveform and the alternating voltage waveform and a phase difference between the alternating current waveform and the alternating voltage waveform. Alternatively, in a case where a rectangular wave signal or a M-sequence signal generated by superimposing waveform signals with multiple frequencies on each other is used as the signal for impedance measurement to be superimposed on the output signal of the fuel cell 21, the impedance calculation unit 46 may obtain the impedance at each frequency by demultiplexing the multiplexed signal by performing fast Fourier transform (FFT) analysis on the obtained alternating current waveform and alternating voltage waveform. Further, for each of one or more frequencies, the impedance calculation unit 46 may obtain, as the impedance at each frequency, an average impedance value calculated from the amplitude and the phase difference in each cycle of the alternating current waveform and the alternating voltage waveform. The amplitude in each cycle of the alternating current waveform and the alternating voltage waveform may be obtained as, for example, a difference between a minimum value and a maximum value of the current I or the voltage V in each cycle.

(2-3. Electric Power Control Apparatus)

The electric power control apparatus 50 serves as an apparatus that controls supply of electric power to the inverter 27 by allowing one or more processors such as a CPU to execute a computer program. The electric power control apparatus 50 also serves as an apparatus that diagnoses the state of the fuel cell 21 by allowing the one or more processors such as a CPU to execute a computer program. The computer program is a computer program that causes the processor to perform operation described later to be performed by the electric power control apparatus 50. The computer program to be executed by the processor may be contained in a recording medium serving as a storage (memory) 59 provided in the electric power control apparatus 50, or may be contained in a recording medium built in the electric power control apparatus 50 or any recording medium externally attachable to the electric power control apparatus 50.

The recording medium containing the computer program may be: a magnetic medium such as a hard disk, a floppy disk, or a magnetic tape; an optical recording medium such as a CD-ROM, a DVD, or a Blu-ray (registered trademark); a magnetic-optical medium such as a floptical disk; a memory such as a RAM or a ROM; a flash memory such as a USB memory or an SSD; or any other medium that is able to hold programs.

The electric power control apparatus 50 includes the processor 51 and the storage 59. The processor 51 includes, for example, one or more processors such as a CPU. A portion or all of the processor 51 may include an updatable one such as firmware, or may be a program module to be executed in accordance with a command from, for example, a CPU.

The storage 59 includes a memory that is communicably coupled to the processor, and contains, for example, a computer program to be executed by the processor, a control parameter, and acquired information. The storage 59 may include a memory such as a RAM or a ROM, or may include a memory device such as a CD-ROM or a storage device.

The electric power control apparatus 50 is communicably coupled, via a communication means such as a CAN or a dedicated line, to the impedance measurement apparatus 40, the vehicle drive control apparatus 60, the surrounding environment sensor 11, the vehicle state sensor 15, and the GPS sensor 17.

The processor 51 includes an electric power supply control unit 52, a diagnosis unit 53, an electric power consumption estimation unit 54, a remaining capacity estimation unit 55, and a battery charging and discharging control unit 56. A portion or all of the electric power supply control unit 52, the diagnosis unit 53, the electric power consumption estimation unit 54, the remaining capacity estimation unit 55, and the battery charging and discharging control unit 56 may be a function to be implemented by execution of the computer program by the processor. Alternatively, a portion or all of these units may be configured by an analog circuit.

(Electric Power Supply Control Unit)

The electric power supply control unit 52 executes a process of controlling supply of electric power to the inverter 27 that controls driving of the drive motor 29. The electric power supply control unit 52 executes different processes between the impedance measurement period and a period other than the impedance measurement period.

In the period other than the impedance measurement period, the electric power supply control unit 52 controls the output of the fuel cell 21, in cooperation with torque control of causing the drive motor 29 to output the driving torque corresponding to the requested acceleration rate of the fuel cell vehicle 1. In the process in the period other than the impedance measurement period, the generated current of the fuel cell 21 changes depending on a fluctuation in the driving torque of the drive motor 29 or a change in the open-circuit voltage of the secondary battery 31. In contrast, in the impedance measurement period, the electric power supply control unit 52 controls the output of the fuel cell 21 by so-called constant-current control, to set the generated current of the fuel cell 21 to a preset constant value. At this occasion, in a case where a fluctuation in the requested electric power of the drive motor 29 results in an excess or shortage of the output electric power of the fuel cell 21 with respect to the requested electric power of the drive motor 29, electric power corresponding to the excess or shortage is made up for with the output electric power of the secondary battery 31.

Specifically, the electric power supply control unit 52 fixes the generated current of the fuel cell 21 at any constant value during the impedance measurement period. In a case where the output electric power of the fuel cell 21 is in shortage with respect to the requested electric power of the drive motor 29, the electric power supply control unit 52 drives the converter 25 to make an output voltage of the converter 25 equivalent to the open-circuit voltage of the secondary battery 31. Thus, the output electric power of the fuel cell 21 and the output electric power of the secondary battery 31 are supplied to the drive motor 29. In contrast, in a case where the output electric power of the fuel cell 21 is in excess with respect to the requested electric power of the drive motor 29, the electric power supply control unit 52 drives the converter 25 to make the output voltage of the converter 25 higher than the open-circuit voltage of the secondary battery 31, and charge the secondary battery 31 with excess electric power via the secondary battery converter 33.

(Diagnosis Unit)

The diagnosis unit 53 executes a process of setting a frequency at which the impedance is to be measured, and outputting a command signal to the impedance measurement apparatus 40. The frequency to be set is a frequency of the alternating-current signal to be superimposed on the output electric power from the fuel cell 21, and is set depending on a purpose of the diagnosis on the fuel cell 21. For example, setting the frequency in a high-frequency region makes it possible to diagnose a wet state of the MEA of the fuel cell 21. Setting the frequency in a low-frequency region makes it possible to diagnose a gas supply state, e.g., whether the fuel gas such as the hydrogen gas or the air is sufficiently supplied to an electric power generating part of the fuel cell 21. The diagnosis unit 53 may set the frequency at which the impedance is to be measured, while sequentially or randomly changing the frequency throughout the entire range of the low-frequency region and the high-frequency region. Alternatively, the diagnosis unit 53 may set one specific frequency as the frequency at which the impedance is to be measured, depending on the purpose of the diagnosis.

In addition, the diagnosis unit 53 acquires information on the impedance at each frequency transmitted from the impedance measurement apparatus 40, and diagnoses the state of the fuel cell 21 on the basis of the acquired information. For example, the diagnosis unit 53 compares an impedance characteristic (a reference) in an initial state at the start of the use of the fuel cell 21, and an impedance characteristic (a measurement result) measured by the impedance measurement apparatus 40. Further, the diagnosis unit 53 is able to determine the state of the fuel cell 21 depending on state transition of the impedance characteristic in a known Cole-Cole plot. A process of determining the internal state of the fuel cell 21 based on an impedance measurement result may be performed by applying an existing known technique, and therefore detailed description thereof is omitted.

(Electric Power Consumption Estimation Unit)

The electric power consumption estimation unit 54 executes a process of estimating electric power consumption in the impedance measurement period in advance. Specifically, the electric power consumption estimation unit 54 calculates the electric power consumption by estimating a load on the drive motor 29 in the impedance measurement period, on the basis of at least information on a current position of the fuel cell vehicle 1, information on a road traffic situation of a planned travel route of the fuel cell vehicle 1, information on the surrounding environment of the fuel cell vehicle 1, and information on a traveling state of the fuel cell vehicle 1. For example, the electric power consumption in a period in which the drive motor 29 is estimated to output the driving torque is a positive value corresponding to a requested driving torque. In contrast, the electric power consumption in a period in which the drive motor 29 is estimated to be regeneratively driven is a negative value corresponding to a requested braking torque. The electric power consumption estimation unit 54 adds up the electric power consumption estimated during the impedance measurement period, to calculate the electric power consumption by the drive motor 29 in the impedance measurement period.

The electric power consumption estimation unit 54 may include electric power consumption of the vehicle auxiliary equipment supplied from the secondary battery 31, in the electric power consumption in the impedance measurement period. For example, the electric power consumption estimation unit 54 calculates the electric power consumption of the vehicle auxiliary equipment on the basis of an operation state of equipment with a relatively large amount of electric power consumption, such as an air conditioner, and adds the calculated electric power consumption to the electric power consumption by the drive motor 29.

(Remaining Capacity Estimation Unit)

The remaining capacity estimation unit 55 executes a process of estimating the remaining capacity of the secondary battery 31 after execution of the impedance measurement process, on the basis of expected generated electric power of the fuel cell 21 in the impedance measurement period, and the electric power consumption estimated by the electric power consumption estimation unit 54. Specifically, in the example embodiment, because the generated current is set to a constant value during the impedance measurement period, the remaining capacity estimation unit 55 calculates the expected generated electric power of the fuel cell 21 by multiplying generated electric power per unit time by assumed impedance measurement time. For example, a unit measurement time for measurement of the impedance at one frequency may be defined, and the impedance measurement time may be obtained by multiplying the number of the frequencies at which the impedance is to be measured by the unit measurement time. Note that a method of calculating the impedance measurement time is not limited to this example.

In addition, the remaining capacity estimation unit 55 estimates the remaining capacity of the secondary battery 31 at the end of the impedance measurement period, assuming that the secondary battery 31 is charged with a value obtained by subtracting the electric power consumption estimated by the electric power consumption estimation unit 54 from the expected generated electric power of the fuel cell 21 that has been calculated. A case where the value obtained by subtracting the electric power consumption from the expected generated electric power is a negative value indicates a state in which the secondary battery 31 discharges electric power.

(Battery Charging and Discharging Control Unit)

The battery charging and discharging control unit 56 executes a process of performing charging and discharging of the secondary battery 31 before start of the impedance measurement process, to make the remaining capacity of the secondary battery 31 estimated by the remaining capacity estimation unit 55 equal to or greater than a predetermined lower limit value and equal to or less than a predetermined upper limit value. In a case where the estimated remaining capacity is less than the predetermined lower limit value, the battery charging and discharging control unit 56 performs a process of charging the secondary battery 31 with at least electric power corresponding to the shortage below the lower limit value. In contrast, in a case where the estimated remaining capacity is greater than the predetermined upper limit value, the battery charging and discharging control unit 56 performs a process of causing the secondary battery 31 to discharge at least excess electric power exceeding the upper limit value.

In the example embodiment, the battery charging and discharging control unit 56 performs charging and discharging of the secondary battery 31, by increasing or reducing the output electric power of the fuel cell 21 to thereby charge the secondary battery 31 with the output electric power of the fuel cell 21 or supply the output electric power of the secondary battery 31 to the drive motor 29. Specifically, the battery charging and discharging control unit 56 performs charging and discharging of the secondary battery 31 by increasing or reducing the output electric power of the fuel cell 21, by increasing or reducing a predetermined amount of electric power with respect to generation target electric power set by the electric power supply control unit 52.

3. Operation

Described above is the configuration example of the impedance measurement apparatus 40 and the electric power control apparatus 50. Next, detailed description is given of a series of operations of electric power generation control at the time of the impedance measurement process by the impedance measurement apparatus 40 and the electric power control apparatus 50.

FIG. 3 is a flowchart illustrating an example of a process to be executed by the electric power control apparatus 50. The process illustrated in the flowchart of FIG. 3 is constantly executed while the fuel cell system 20 is in operation.

First, the diagnosis unit 53 determines whether the process of measuring the impedance of the fuel cell 21 is to be executed (step S11). A method of determining whether the impedance measurement process is to be executed is not particularly limited, and the determination may be made depending on whether a preset execution timing has arrived. If it is not determined that the impedance measurement process is to be executed (S11/No), the electric power supply control unit 52 controls the electric power generation of the fuel cell 21, in cooperation with driving torque control on the drive motor 29 to be executed by the vehicle drive control apparatus 60 (step S13).

An example of the electric power generation control on the fuel cell 21 in cooperation with the driving torque control on the drive motor 29 is described. For example, the electric power supply control unit 52 acquires information on the target driving torque of the drive motor 29 from the vehicle drive control apparatus 60, and calculates requested electric power W_ve_dem of the drive motor 29. The electric power supply control unit 52 may acquire information on the requested electric power W_ve_dem calculated by the vehicle drive control apparatus 60. In addition, the electric power supply control unit 52 acquires information on the open-circuit voltage or a remaining capacity W_soc of the secondary battery 31, and determines whether the secondary battery 31 is to be charged. For example, if the remaining capacity W_soc of the secondary battery 31 is less than a preset lower limit value, the electric power supply control unit 52 determines that the secondary battery 31 is to be charged. The lower limit value may be, for example, a value corresponding to 20% in a case where an initial remaining capacity at the start of the use of the secondary battery 31 is assumed to be 100%. This makes it possible to suppress deterioration or an electric power shortage state caused by overdischarge of the secondary battery 31.

In a case where the requested electric power W_ve_dem of the drive motor 29 is equal to or less than maximum generated electric power of the fuel cell 21 and where the secondary battery 31 does not have to be charged, the electric power supply control unit 52 sets the requested electric power W_ve_dem of the drive motor 29 as generation target electric power W_fc_dem of the fuel cell 21. Thus, the electric power control apparatus 50 drives the drive motor 29 with the output electric power of the fuel cell 21. At this occasion, the electric power supply control unit 52 may set the output of the fuel cell 21 to bring electric power generation efficiency to a high level, and, in a case where there is excess electric power, charge the secondary battery 31 with the excess electric power via the secondary battery converter 33.

In a case where the requested electric power W_ve_dem of the drive motor 29 is equal to or less than the maximum generated electric power of the fuel cell 21 and where the secondary battery 31 is to be charged, the electric power supply control unit 52 sets the maximum generated electric power as the generation target electric power W_fc_dem, and drives the converter 25 to make the output voltage of the converter 25 higher than the open-circuit voltage of the secondary battery 31. Thus, the electric power control apparatus 50 drives the drive motor 29 with the output electric power of the fuel cell 21, and charges the secondary battery 31 with excess electric power via the secondary battery converter 33.

In a case where the requested electric power W_ve_dem of the drive motor 29 is greater than the maximum generated electric power of the fuel cell 21, the electric power supply control unit 52 sets the maximum generated electric power as the generation target electric power, and drives the converter 25 to make the output voltage of the converter 25 equivalent to the open-circuit voltage of the secondary battery 31, and distribute the requested electric power W_ve_dem of the drive motor 29 between the fuel cell 21 and the secondary battery 31. Thus, the drive motor 29 is driven by the output electric power of the fuel cell 21 and the output electric power of the secondary battery 31.

Note that the electric power supply control unit 52 may set the generation target electric power W_fc_dem of the fuel cell 21 to make, as well as the maximum generated electric power of the fuel cell 21, an increase speed of the output electric power of the fuel cell 21 equal to or less than a preset threshold. In addition, if the remaining capacity W_soc of the secondary battery 31 is greater than a preset upper limit value W_soc_max, the electric power supply control unit 52 may stop the electric power generation of the fuel cell 21, and drive the drive motor 29 with only the output electric power of the secondary battery 31 to perform discharging of the secondary battery 31. The upper limit value may be, for example, a value corresponding to 80% in a case where the initial remaining capacity at the start of the use of the secondary battery 31 is assumed to be 100%. This makes it possible to suppress deterioration caused by overcharge of the secondary battery 31 or a decrease in electric power efficiency caused by electric power release.

The electric power control apparatus 50 executes the electric power generation control in cooperation with the driving torque control in step S13, unless it is determined that the impedance measurement process is to be executed in step S11. In contrast, if it is determined that the impedance measurement process is to be executed in step S11 (S11/Yes), the diagnosis unit 53 sets the generated current of the fuel cell 21 during the impedance measurement period (step S15). The value of the generated current may be any value, and may be a preset fixed value. In a case where the generated current of the fuel cell 21 during the impedance measurement process is set to a fixed value, the process in step S15 may be omitted.

Thereafter, the remaining capacity estimation unit 55 estimates expected generated electric power W_fc_est of the fuel cell 21 in the impedance measurement period (step S17). Specifically, the remaining capacity estimation unit 55 calculates the expected generated electric power W_fc_est of the fuel cell 21, by multiplying generated electric power per unit time corresponding to the generated current set in step S15 or the generated current with the preset fixed value, by assumed impedance measurement time. For example, a unit measurement time for measurement of the impedance at each frequency may be defined, and the impedance measurement time may be obtained by multiplying the number of the frequencies at which the impedance is to be measured by the unit measurement time. Note that the method of calculating the impedance measurement time is not limited to this example.

Thereafter, the electric power consumption estimation unit 54 acquires information on a driving situation of the fuel cell vehicle 1 (step S19). Specifically, the electric power consumption estimation unit 54 acquires information on the current position of the fuel cell vehicle 1, information on the traffic situation of the planned travel route of the fuel cell vehicle 1, information on the surrounding environment of the fuel cell vehicle 1, and information on the traveling state of the fuel cell vehicle 1. The information on the current position of the fuel cell vehicle 1 may be acquired on the basis of the position information transmitted from the GPS sensor 17. The information on the traffic situation of the planned travel route of the fuel cell vehicle 1 includes, regarding the planned travel route during the impedance measurement period, information on a speed limit, traffic congestion information, information on a road shape such as a curvature radius or an inclination angle, and information on a road type such as a general road or an expressway. The traffic congestion information may be acquired from a road information service provider, for example, via a communication means such as mobile communication, road-to-vehicle communication, or a beacon. Information on the traffic situation of the planned travel route other than the traffic congestion information is acquired from a database containing map data and road information. The database may be an unillustrated cloud server coupled to the electric power control apparatus 50 via mobile communication, or may be a vehicle-mounted database.

The information on the surrounding environment of the fuel cell vehicle 1 may be acquired on the basis of a detection signal transmitted from the surrounding environment sensor 11. The information on the surrounding environment includes at least information on another vehicle traveling ahead of the fuel cell vehicle 1 and a road shape ahead. Such information on the surrounding environment includes information on an object that can hinder traveling of the fuel cell vehicle 1. The information on the traveling state of the fuel cell vehicle 1 may be acquired on the basis of a detection signal transmitted from the vehicle state sensor 15. The information on the traveling state includes at least information on the vehicle speed and the acceleration rate of the fuel cell vehicle 1. In a case where the fuel cell vehicle 1 is a vehicle that is able to execute automatic driving control such as adaptive cruise control (ACC), the information on the traveling state includes information on a control state of the automatic driving control.

Note that the information on the driving situation of the fuel cell vehicle 1 may include information other than the information on the current position of the fuel cell vehicle 1, the information on the traffic situation of the planned travel route of the fuel cell vehicle 1, the information on the surrounding environment of the fuel cell vehicle 1, and the information on the traveling state of the fuel cell vehicle 1.

Thereafter, the electric power consumption estimation unit 54 estimates electric power consumption W_con in the impedance measurement period (step S21). Specifically, the electric power consumption estimation unit 54 predicts transition of the driving torque of the drive motor 29 on the basis of the acquired information on the driving situation of the fuel cell vehicle 1. For example, in a period in which the requested acceleration rate of the fuel cell vehicle 1 is predicted to be a positive value, the driving torque is a positive value because the drive motor 29 outputs the driving torque. In a period in which the requested acceleration rate of the fuel cell vehicle 1 is predicted to be a negative value (the requested deceleration rate is predicted to be a positive value), the driving torque is a negative value because the drive motor 29 outputs braking torque. The electric power consumption estimation unit 54 calculates the driving torque for each predetermined unit time of the impedance measurement period, and adds up the calculated driving torque, to thereby calculate the electric power consumption W_con by the drive motor 29 in the impedance measurement period.

Note that the electric power consumption estimation unit 54 may calculate the electric power consumption W_con in the impedance measurement period, including the electric power consumption of the vehicle auxiliary equipment supplied from the secondary battery 31. For example, the electric power consumption estimation unit 54 calculates the electric power consumption of the vehicle auxiliary equipment on the basis of the operation state of equipment with a relatively large amount of electric power consumption, such as an air conditioner, and adds the calculated electric power consumption to the electric power consumption by the drive motor 29. This makes it possible to enhance estimation accuracy of the electric power consumption by the end of the impedance measurement period.

Thereafter, the remaining capacity estimation unit 55 calculates a remaining capacity estimate W_soc_est of the secondary battery 31 after the end of execution of the impedance measurement process (step S23). Specifically, the remaining capacity estimation unit 55 calculates the remaining capacity estimate W_soc_est of the secondary battery 31 after the end of execution of the impedance measurement process, by adding the expected generated electric power W_fc_est estimated in step S17 and subtracting the electric power consumption W_con estimated in step S21, to and from the remaining capacity W_soc of the secondary battery 31 at the start of the impedance measurement process. In a case where time is short from an estimation time of the remaining capacity of the secondary battery 31 after the end of execution of the impedance measurement process to a start time of the impedance measurement process, the current value of the remaining capacity of the secondary battery 31 may be used as the remaining capacity W_soc of the secondary battery 31 at the start of the impedance measurement process. Alternatively, the remaining capacity W_soc of the secondary battery 31 at the start of the impedance measurement process may be estimated by a procedure similar to the method of estimating the remaining capacity of the secondary battery 31 after the end of execution of the impedance measurement process.

Further, the expected generated electric power W_fc_est and the electric power consumption W_con may be estimated regarding a period after it is determined that the impedance measurement process is to be executed in step S11 until execution of the impedance measurement process ends, including the impedance measurement process period. The remaining capacity estimate W_soc_est of the secondary battery 31 after the end of execution of the impedance measurement process may be calculated by adding the expected generated electric power W_fc_est and subtracting the electric power consumption W_con to and from the remaining capacity W_soc of the secondary battery 31 when it is determined that the impedance measurement process is to be executed.

Thereafter, the remaining capacity estimation unit 55 determines whether the estimated remaining capacity estimate W_soc_est of the secondary battery 31 after the end of execution of the impedance measurement process is equal to or greater than a preset lower limit value W_soc_min (step S25). The lower limit value W_soc_min may be, for example, a lower limit value (e.g., 20%) set to suppress deterioration or an electric power shortage caused by over-discharge of the secondary battery 31, but a different value may be set.

If the estimated remaining capacity estimate W_soc_est of the secondary battery 31 after the end of execution of the impedance measurement process is less than the lower limit value W_soc_min (S25/No), the battery charging and discharging control unit 56 performs charging of the secondary battery 31 before the start of the impedance measurement process, to make the estimated remaining capacity estimate W_soc_est of the secondary battery 31 after the end of execution of the impedance measurement process equal to or greater than the lower limit value W_soc_min and equal to or less than the upper limit value W_soc_max (step S27). In the example embodiment, the battery charging and discharging control unit 56 executes a process of charging the secondary battery 31, by adding a correction electric power value W_fc_rev with a predetermined amount to the generation target electric power W_fc_dem in the electric power generation control on the fuel cell 21 (the process in step S13) executed in the period other than the impedance measurement process period.

The battery charging and discharging control unit 56 increases the generation target electric power W_fc_dem in such a manner that the total of the correction electric power value W_fc_rev to be added equals a difference obtained by subtracting the remaining capacity estimate W_soc_est estimated in step S23 from a target value of the remaining capacity of the secondary battery 31 after the end of execution of the impedance measurement process. For example, in a period before the start of the impedance measurement process, the battery charging and discharging control unit 56 adds an amount of electric power obtained by dividing the difference by time before the start of the impedance measurement process, as the correction electric power value W_fc_rev, to the generation target electric power W_fc_dem. The battery charging and discharging control unit 56 may add a preset constant correction electric power value W_fc_rev, or may vary the correction electric power value W_fc_rev to be added, depending on a difference between the generation target electric power before the addition and the maximum generated electric power, or depending on the electric power generation efficiency.

The target value of the remaining capacity of the secondary battery 31 after the end of execution of the impedance measurement process may be set to any value within a range of equal to or greater than the lower limit value W_soc_min and equal to less than the upper limit value W_soc_max of the remaining capacity of the secondary battery 31. However, for example, the target value is preferably set within a range of the lower limit value W_soc_min plus 0 to 10%, to prevent a start timing of the impedance measurement process from being greatly delayed. In a case where the target driving torque of the drive motor 29 after the end of execution of impedance measurement process is assumed to be large, the target value of the remaining capacity is preferably set to a higher value than in the example described above, for example, within a range of the lower limit value W_soc_min plus 20 to 30%, to prevent a decrease in the remaining capacity W_soc of the secondary battery 31 after the impedance measurement process.

After completion of the process in step S27, the diagnosis unit 53 executes the impedance measurement process (step S33). In contrast, if the estimated remaining capacity estimate W_soc_est of the secondary battery 31 after the end of execution of the impedance measurement process is equal to or greater than the lower limit value W_soc_min in step S25 (S25/Yes), the remaining capacity estimation unit 55 determines whether the estimated remaining capacity estimate W_soc_est of the secondary battery 31 after the end of execution of the impedance measurement process is equal to or less than the preset upper limit value W_soc_max (step S29). The upper limit value W_soc_max may be, for example, an upper limit value (e.g., 80%) set to suppress deterioration or a decrease in the electric power efficiency caused by overcharge of the secondary battery 31, but a different value may be set.

If the estimated remaining capacity estimate W_soc_est of the secondary battery 31 after the end of execution of the impedance measurement process is equal to or less than the upper limit value W_soc_max (S29/Yes), the diagnosis unit 53 executes the impedance measurement process (step S33). In contrast, if the estimated remaining capacity estimate W_soc_est of the secondary battery 31 after the end of execution of the impedance measurement process is greater than the upper limit value W_soc_max (S29/No), the battery charging and discharging control unit 56 performs charging of the secondary battery 31 before the start of the impedance measurement process, to make the estimated remaining capacity estimate W_soc_est of the secondary battery 31 after the end of execution of the impedance measurement process equal to or greater than the lower limit value W_soc_min and equal to or less than the upper limit value W_soc_max (step S31). In the example embodiment, the battery charging and discharging control unit 56 executes a process of supplying electric power from the secondary battery 31 to the drive motor 29, by subtracting the correction electric power value W_fc_rev with a predetermined amount from the generation target electric power in the electric power generation control on the fuel cell 21 (the process in step S13) executed in the period other than the impedance measurement process period.

The battery charging and discharging control unit 56 reduces the generation target electric power W_fc_dem in such a manner that the total of the correction electric power value W_fc_rev to be subtracted equals a difference obtained by subtracting the target value of the remaining capacity of the secondary battery 31 after the end of execution of the impedance measurement process from the remaining capacity estimate W_soc_est estimated in step S23. For example, in the period before the start of the impedance measurement process, the battery charging and discharging control unit 56 subtracts the correction electric power value W_fc_rev obtained by dividing the difference by the time before the start of impedance measurement process, from the generation target electric power. The battery charging and discharging control unit 56 may subtract a preset constant correction electric power value W_fc_rev, or may set the correction electric power value W_fc_rev to be subtracted depending on the electric power generation efficiency. The target value of the remaining capacity of the secondary battery 31 after the end of execution of the impedance measurement process may be set to any value within a range of equal to or greater than the lower limit value W_soc_min and equal to or less than the upper limit value W_soc_max of the remaining capacity estimate W_soc_est of the secondary battery 31. However, for example, the target value is preferably set within a range of the upper limit value W_soc_max minus 0 to 10%, to prevent the start timing of the impedance measurement process from being greatly delayed.

After completion of the process in step S31, the diagnosis unit 53 executes the impedance measurement process (step S33).

FIG. 4 is an explanatory diagram illustrating an example of a process of calculating the generation target electric power of the fuel cell 21 before the start of the impedance measurement process, to be executed in step S17 to step S31.

The remaining capacity estimation unit 55 adds the electric power consumption W_con and the expected generated electric power W_fc_est during the impedance measurement period that have been estimated, to obtain an electric power balance W_a during the impedance measurement period. In addition, the remaining capacity estimation unit 55 adds the electric power balance W_a to the remaining capacity W_soc of the secondary battery 31 to thereby calculate the remaining capacity estimate W_soc_est of the secondary battery 31 after the impedance measurement process.

The battery charging and discharging control unit 56 compares the remaining capacity estimate W_soc_est with the upper limit value W_soc_max and the lower limit value W_soc_min, and calculates charging and discharging requested electric power W_bat_dem of the secondary battery 31. Specifically, in a case where the remaining capacity estimate W_soc_est is greater than the upper limit value W_soc_max, the battery charging and discharging control unit 56 calculates a difference (<0) obtained by subtracting the remaining capacity estimate W_soc_est from the upper limit value W_soc_max, as the charging and discharging requested electric power W_bat_dem. In this case, the charging and discharging requested electric power W_bat_dem (<0) represents a discharging requested electric power value.

In contrast, in a case where the remaining capacity estimate W_soc_est is less than the lower limit value W_soc_min, the battery charging and discharging control unit 56 calculates a difference (>0) obtained by subtracting the remaining capacity estimate W_soc_est from the lower limit value W_soc_min, as the charging and discharging requested electric power W_bat_dem. In this case, the charging and discharging requested electric power W_bat_dem (>0) represents a charging requested electric power value. In a case where the remaining capacity estimate W_soc_est is equal to or greater than the lower limit value W_soc_min and equal to or less than the upper limit value W_soc_max, the battery charging and discharging control unit 56 sets the charging and discharging requested electric power W_bat_dem to zero.

The battery charging and discharging control unit 56 calculates the correction electric power value W_fc_rev for the generation target electric power of the fuel cell 21, by dividing the calculated charging and discharging requested electric power W_bat_dem by time T_est before the start of the impedance measurement process. In the period before the start of the impedance measurement process, the electric power supply control unit 52 adds the correction electric power value W_fc_rev to the requested electric power W_ve_dem calculated on the basis of the target driving torque acquired from the vehicle drive control apparatus 60, to calculate the generation target electric power W_fc_dem of the fuel cell 21. Requested electric power of the vehicle auxiliary equipment such as an air conditioner may be further added to obtain the generation target electric power W_fc_dem. The electric power supply control unit 52 controls driving of the fuel cell auxiliary equipment 23 on the basis of the calculated generation target electric power W_fc_dem, to execute the electric power generation control on the fuel cell 21.

The impedance measurement process in step S33 of FIG. 3 is started by a command signal being transmitted from the electric power control apparatus 50 to the impedance measurement apparatus 40. The impedance measurement process to be performed by the impedance measurement apparatus 40 is briefly described.

The superimposed signal generation unit 42 of the impedance measurement apparatus 40 sets a waveform of an alternating current for impedance measurement on the basis of the command signal transmitted from the electric power control apparatus 50, and outputs the set alternating-current signal to the converter 25. Thus, the converter 25 operates the switching devices on the basis of the inputted alternating-current signal, to superimpose an alternating current waveform on the output electric power of the fuel cell 21. Thereafter, the output electric power detection unit 44 acquires the sensor signals of the voltage sensor 81 and the current sensor 83 in a preset sampling cycle, and records data on the output current I and the output voltage V. The detected data on the output current I and the output voltage V is recorded as data on the alternating current waveform and an alternating voltage waveform having the alternating-current signal for impedance measurement superimposed thereon.

Thereafter, the impedance calculation unit 46 executes the process of calculating the impedance of the fuel cell 21 on the basis of the recorded alternating current waveform and alternating voltage waveform. For example, for each cycle, the impedance calculation unit 46 calculates the impedance in each cycle from the amplitudes of the alternating current waveform and the alternating voltage waveform and the phase difference between the alternating current waveform and the alternating voltage waveform, and obtains an average value of the impedances as the impedance at the present frequency. The impedance calculation unit 46 calculates the impedance regarding all the frequencies indicated by the electric power control apparatus 50, and outputs information on the calculated impedance to the electric power control apparatus 50.

Next, a process to be performed by the electric power control apparatus 50 during the impedance measurement process is described. FIG. 5 is a flowchart illustrating the process to be performed by the electric power control apparatus 50 during the impedance measurement process.

First, the diagnosis unit 53 outputs an impedance measurement command signal to the impedance measurement apparatus 40 (step S41). The impedance measurement command signal may include, for example, information on the frequency at which the impedance is to be measured. Thereafter, the electric power supply control unit 52 fixes the generated current of the fuel cell 21 at the measurement current set in step S15, and starts output control on the fuel cell 21 by the constant-current control (step S43).

Thereafter, the electric power supply control unit 52 calculates the requested electric power W_ve_dem of the drive motor 29, on the basis of information on the target driving torque of the drive motor 29 from the vehicle drive control apparatus 60 (step S45). Thereafter, the electric power supply control unit 52 determines whether generated electric power W_fc of the fuel cell 21 is greater than the requested electric power W_ve_dem (step S47). If the generated electric power W_fc of the fuel cell 21 is greater than the requested electric power W_ve_dem (S47/Yes), the electric power supply control unit 52 executes a process of charging the secondary battery 31 (step S49). Specifically, the electric power supply control unit 52 drives the converter 25 to make the output voltage of the converter 25 higher than the open-circuit voltage of the secondary battery 31, and charges the secondary battery 31 with excess electric power via the secondary battery converter 33.

In contrast, if the generated electric power W_fc of the fuel cell 21 is not greater than the requested electric power W_ve_dem (S47/No), the electric power supply control unit 52 determines whether the generated electric power W_fc of the fuel cell 21 is less than the requested electric power W_ve_dem (step S51). If the generated electric power W_fc of the fuel cell 21 is less than the requested electric power W_ve_dem (S51/Yes), the electric power supply control unit 52 executes a process of outputting electric power of the secondary battery 31 (step S53). Specifically, the electric power supply control unit 52 drives the converter 25 to make the output voltage of the converter 25 equivalent to the open-circuit voltage of the secondary battery 31. Thus, the output electric power of the fuel cell 21 and the output electric power of the secondary battery 31 are supplied to the drive motor 29.

In contrast, if the generated electric power W_fc of the fuel cell 21 is not less than the requested electric power W_ve_dem (S51/No), i.e., if the generated electric power W_fc of the fuel cell 21 is equal to the requested electric power W_ve_dem, the electric power supply control unit 52 directly proceeds to step S55.

Thereafter, the electric power supply control unit 52 determines whether the impedance measurement process has ended (step S55). For example, the electric power supply control unit 52 may determine that the impedance measurement process has ended, in a case where the diagnosis unit 53 acquires information on the impedance measurement result regarding all the frequencies from the impedance measurement apparatus 40. If it is not determined that the impedance measurement process has ended (S55/No), the electric power supply control unit 52 returns to step S45, and repeatedly executes the processes in the steps described above.

In contrast, if it is determined that the impedance measurement process has ended (S55/Yes), the electric power supply control unit 52 switches to the electric power generation control on the fuel cell 21 in cooperation with the driving torque control on the drive motor 29 by the vehicle drive control apparatus 60 (step S57). Thereafter, the process returns to step S41, and the processes in the steps described above are repeatedly executed.

4. Workings

Next, description is given of workings of the electric power generation control on the fuel cell 21 by the electric power control apparatus 50 according to the example embodiment.

FIG. 6 is an explanatory diagram illustrating an example of the electric power generation control in a case where it is determined that the remaining capacity W_soc of the secondary battery 31 after the end of the impedance measurement process is less than the lower limit value W_soc_min, and illustrates transition of the remaining capacity W_soc of the secondary battery 31, the generated electric power W_fc of the fuel cell 21, and the correction electric power value W_fc_rev.

A remaining capacity W_soc' indicated by a dashed line represents transition of the remaining capacity in a case where, before the start of the impedance measurement process, charging and discharging of the secondary battery 31 is not executed to make the estimated remaining capacity W_soc of the secondary battery 31 fall within a range from the lower limit value W_soc_min to the upper limit value W_soc_max. In the example illustrated in FIG. 6, the remaining capacity W_soc' falls below the lower limit value W_soc_min during the impedance measurement process. Therefore, for example, at time T1, the battery charging and discharging control unit 56 determines that the remaining capacity W_soc' after the impedance measurement process falls below the lower limit value W_soc_min.

Therefore, in a period between times T2 and T3 before an impedance measurement period X, the electric power supply control unit 52 corrects and increases the generated electric power W_fc of the fuel cell 21. In the example illustrated in FIG. 6, a difference obtained by subtracting the remaining capacity W_soc at time T2 from the upper limit value W_soc_max of the remaining capacity is calculated as the charging and discharging requested electric power W_bat_dem (>0), and a value obtained by dividing the charging and discharging requested electric power W_bat_dem by the time T_est between times T2 and T3 is set as the correction electric power value W_fc_rev. Further, during the period between times T2 and T3, the electric power supply control unit 52 adds the correction electric power value W_fc_rev to the requested electric power W_ve_dem of the drive motor 29 to execute the electric power generation control on the fuel cell 21. Thus, the remaining capacity W_soc of the secondary battery 31 at time T3 rises to the upper limit value W_soc_max.

In addition, in the impedance measurement period X, the electric power supply control unit 52 sets the generated current of the fuel cell 21 to a constant value to execute the constant-current control. In the impedance measurement period X, the alternating-current signal for impedance measurement is superimposed on the output electric power of the fuel cell 21. In a period between times T4 and T5 corresponding to the impedance measurement period X, electric power W_bat corresponding to a difference obtained by subtracting the generated electric power W_fc of the fuel cell 21 from the requested electric power W_ve_dem of the drive motor 29 is made up for with the output electric power of the secondary battery 31. Therefore, although the remaining capacity W_soc of the secondary battery 31 decreases in the impedance measurement period X, the remaining capacity W_soc is kept within the range of equal to or greater than the lower limit value W_soc_min and equal to or less than the upper limit value W_soc_max even after the end of the impedance measurement period X, because the remaining capacity W_soc has been raised to the upper limit value W_soc_max in advance.

As described above, the electric power control apparatus 50 of the fuel cell system 20 according to the example embodiment executes the electric power generation control on the fuel cell 21 by the constant-current control during the impedance measurement period, and makes up for electric power in excess or shortage with respect to the requested electric power W_ve_dem of the drive motor 29 with electric power of the secondary battery 31. Thus, while securing the requested electric power W_ve_dem of the drive motor 29, it is possible to measure the impedance by superimposing the alternating-current signal in a state in which the output of the fuel cell 21 is stable. This makes it possible to enhance measurement accuracy of the impedance in every frequency band, making it possible to accurately diagnose the state of the fuel cell 21.

In addition, the electric power control apparatus 50 according to the example embodiment estimates the remaining capacity estimate W_soc_est of the secondary battery 31 after the end of the impedance measurement process in advance, and performs charging and discharging of the secondary battery 31 before the start of the impedance measurement process, to make the estimated remaining capacity estimate W_soc_est fall within a predetermined range from the lower limit value W_soc_min to the upper limit value W_soc_max. Thus, even in a case where the electric power generation control on the fuel cell 21 is executed by the constant-current control during the impedance measurement period, it is possible to make the remaining capacity W_soc of the secondary battery 31 equal to or greater than the lower limit value W_soc_min and equal to or less than W_soc_max even after the end of the impedance measurement process. This makes it possible to suppress deterioration caused by overdischarge or overcharge of the secondary battery 31, and to prevent occurrence of electric power shortage in a case where the target driving torque of the drive motor 29 is large, e.g., at the time of abrupt acceleration.

In addition, the electric power control apparatus 50 according to the example embodiment estimates the electric power consumption W_con of the drive motor and the expected generated electric power W_fc_est of the fuel cell 21 in the impedance measurement process period, and calculates the remaining capacity estimate W_soc_est on the basis of the electric power consumption W_con and the expected generated electric power W_fc_est. Therefore, the remaining capacity estimate W_soc_est of the secondary battery 31 after the end of the impedance measurement process is estimated on the basis of the predicted load on the drive motor 29. This makes it possible to enhance reliability with which the remaining capacity W_soc of the secondary battery 31 after the end of the impedance measurement process is made equal to or greater than the lower limit value W_soc_min and equal to or less than W_soc_max.

In addition, in performing charging and discharging of the secondary battery 31 before the start of the impedance measurement process, the electric power control apparatus 50 according to the example embodiment adds or subtracts the correction electric power value W_fc_rev to or from the generated electric power of the fuel cell 21 corresponding to the requested electric power W_ve_dem of the drive motor 29. This prevents electric power from being released wastefully, making it possible to suppress a decrease in the electric power efficiency.

In addition, in the electric power control apparatus 50 according to the example embodiment, in performing charging and discharging of the secondary battery 31 before the start of the impedance measurement process, it is preferable to add or subtract the constant correction electric power value W_fc_rev, during a period in which the secondary battery 31 is charged and discharged in advance. Thus, the electric power generation control on the fuel cell 21 is performed with the same fluctuation width as a fluctuation width of the generation target electric power in a case where control of charging and discharging the secondary battery 31 in advance is not executed. This makes it possible to prevent an increase in electric power generation load on the fuel cell 21.

Although preferred embodiments of the disclosure have been described in the foregoing with reference to the accompanying drawings, the disclosure is by no means limited to such embodiments. It should be appreciated that various modifications and alterations may be made by persons skilled in the art without departing from the scope as defined by the appended claims. The disclosure is intended to include such modifications and alterations in so far as they fall within the scope of the appended claims.

For example, a computer program that causes the processor 51 of the electric power control apparatus 50 described above to execute a series of processes also falls within the technical scope of the disclosure.

DESCRIPTION OF REFERENCE NUMERALS

1: Fuel cell vehicle
11: Surrounding environment sensor
15: Vehicle state sensor
17: GPS sensor
20: Fuel cell system
21: Fuel cell
25: Converter
27: Inverter
29: Drive motor
31: Secondary battery
33: Secondary battery converter
40: Impedance measurement apparatus
41: Processor
42: Superimposed signal generation unit
44: Output electric power detection unit
46: Impedance calculation unit
49: Storage
50: Electric power control apparatus
51: Processor
52: Electric power supply control unit
53: Diagnosis unit
54: Electric power consumption estimation unit
55: Remaining capacity estimation unit
56: Battery charging and discharging control unit
59: Storage
60: Vehicle drive control apparatus
81: Voltage sensor
83: Current sensor

The invention claimed is:

1. An electric power control apparatus for a fuel cell system provided with a fuel cell, an electric power storage device, and a drive motor, the fuel cell system comprising an impedance measurement unit configured to measure an impedance of the fuel cell based on a current and a voltage measured when alternating-current electric power is superimposed on output electric power of the fuel cell, the electric power control apparatus comprising:

one or more processors; and
one or more memories communicably coupled to the one or more processors, wherein
the one or more processors are configured to execute processing comprising
estimating, in advance, a remaining capacity of the electric power storage device after execution of a process of measuring the impedance,
performing charging and discharging of the electric power storage device before start of the process of measuring the impedance, to make the estimated remaining capacity fall within a predetermined range from a lower limit value to an upper limit value, and
controlling electric power generation of the fuel cell to make a generated current of the fuel cell constant, during the execution of the process of measuring the impedance, and
wherein the one or more processors are configured to
estimate, in advance, electric power consumption by the drive motor and expected generated electric power of the fuel cell in a period in which the process of measuring the impedance is executed, and
estimate the remaining capacity of the electric power storage device after the execution of the process of measuring the impedance, based on the electric power consumption and the expected generated electric power that have been estimated.

2. The electric power control apparatus according to claim 1, wherein the one or more processors are configured to perform the charging and discharging of the electric power storage device by increasing or reducing generated electric power of the fuel cell, before the start of the process of measuring the impedance.

3. A fuel cell system comprising the electric power control apparatus according to claim 2.

4. A vehicle comprising the fuel cell system according to claim 3.

5. A fuel cell system comprising the electric power control apparatus according to claim 1.

6. A vehicle comprising the fuel cell system according to claim 5.

7. The electric power control apparatus according to claim 1, wherein estimating, in advance, the remaining capacity of the electric power storage device after execution of a process of measuring the impedance comprises estimating, in advance, an estimated amount of the remaining capacity of the electric power storage device that is expected to be present after execution of a process of measuring the impedance.

8. An electric power control apparatus for a fuel cell system provided with a fuel cell, an electric power storage device, and a drive motor, the fuel cell system comprising an impedance measurement unit configured to measure an impedance of the fuel cell based on a current and a voltage measured when alternating-current electric power is superimposed on output electric power of the fuel cell, the electric power control apparatus comprising:
an electric power supply control unit configured to control electric power generation of the fuel cell based on a target driving torque of the drive motor set depending on a requested acceleration rate of a fuel cell vehicle, and control the electric power generation of the fuel cell to make a generated current of the fuel cell constant during execution of a process of measuring the impedance;
a remaining capacity estimation unit configured to estimate, in advance, a remaining capacity of the electric power storage device after the execution of the process of measuring the impedance;
an electric power consumption estimation unit configured to estimate, in advance, electric power consumption by the drive motor and expected generated electric power of the fuel cell in a period in which the process of measuring the impedance is executed, and
a battery charging and discharging control unit configured to perform charging and discharging of the electric power storage device before start of the process of measuring the impedance, to make the estimated remaining capacity equal to or greater than a predetermined lower limit value and equal to or less than a predetermined upper limit value.

9. A fuel cell system comprising the electric power control apparatus according to claim 8.

10. A vehicle comprising the fuel cell system according to claim 9.

11. The electric power control apparatus according to claim 8 further comprising a remaining capacity estimation unit configured to estimate the remaining capacity of the electric power storage device after the execution of the process of measuring the impedance, based on the estimated electric power consumption and the expected generated electric power that has been estimated.

12. The electric power control apparatus according to claim 8, wherein the remaining capacity estimation unit is configured to estimate, in advance, an estimated amount of the remaining capacity of the electric power storage device that is expected to be present after execution of a process of measuring the impedance.

13. A non-transitory recording medium containing a computer program to be applied to a fuel cell system provided with a fuel cell, an electric power storage device, and a drive motor, the fuel cell system comprising an impedance measurement unit configured to measure an impedance of the fuel cell based on a current and a voltage measured when alternating-current electric power is superimposed on output electric power of the fuel cell, the computer program causing one or more processors to execute processing comprising:
estimating, in advance, a remaining capacity of the electric power storage device after execution of a process of measuring the impedance,
estimating, in advance, electric power consumption by the drive motor and expected generated electric power of the fuel cell in a period in which the process of measuring the impedance is executed, and
performing charging and discharging of the electric power storage device before start of the process of measuring the impedance, to make the estimated remaining capacity fall within a predetermined range from a lower limit value to an upper limit value; and
controlling electric power generation of the fuel cell to make a generated current of the fuel cell constant, during the execution of the process of measuring the impedance.

14. A fuel cell system comprising a fuel cell, an electric power storage device, a drive motor, and the non-transitory recording medium according to claim 13.

15. A vehicle comprising the fuel cell system according to claim 14.

16. The non-transitory recording medium according to claim 13, wherein the computer program causing one or more processors to execute processing further includes estimating the remaining capacity of the electric power storage device after the execution of the process of measuring the impedance, based on the estimated electric power consumption and the expected generated electric power that has been estimated.

17. The non-transitory recording medium according to claim 13, wherein the estimating, in advance, of the remaining capacity of the electric power storage device after execution of a process of measuring the impedance comprises estimating, in advance, an estimated amount of the remaining capacity of the electric power storage device that is expected to be present after execution of a process of measuring the impedance.

* * * * *